(12) United States Patent
Lu et al.

(10) Patent No.: US 9,859,470 B2
(45) Date of Patent: Jan. 2, 2018

(54) LIGHT-EMITTING DEVICE WITH ADJUSTING ELEMENT

(71) Applicant: EPISTAR CORPORATION, Hsinchu (TW)

(72) Inventors: Chih-Chiang Lu, Hsinchu (TW); Yi-Chieh Lin, Hsinchu (TW); Rong-Ren Lee, Hsinchu (TW); Yu-Ren Peng, Hsinchu (TW); Ming-Siang Huang, Hsinchu (TW); Ming-Ta Chin, Hsinchu (TW); Yi-Ching Lee, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 9 days.

(21) Appl. No.: 15/066,095

(22) Filed: Mar. 10, 2016

(65) Prior Publication Data
US 2017/0263820 A1 Sep. 14, 2017

(51) Int. Cl.
*H01L 33/46* (2010.01)
*H01L 33/60* (2010.01)
*H01L 25/075* (2006.01)

(52) U.S. Cl.
CPC .......... *H01L 33/46* (2013.01); *H01L 25/0753* (2013.01); *H01L 33/60* (2013.01)

(58) Field of Classification Search
CPC ...... H01L 33/46; H01L 33/60; H01L 25/0753
See application file for complete search history.

(56) References Cited

U.S. PATENT DOCUMENTS

| | | | | |
|---|---|---|---|---|
| 5,777,350 A | * | 7/1998 | Nakamura | B82Y 20/00 257/103 |
| 5,808,592 A | * | 9/1998 | Mizutani | G09F 9/33 257/E25.028 |
| 6,712,478 B2 | | 3/2004 | Sheu et al. | |
| 8,283,684 B2 | | 10/2012 | Windisch et al. | |
| 8,884,267 B2 | | 11/2014 | Lin et al. | |
| 2009/0173961 A1 | * | 7/2009 | Windisch | H01L 33/0016 257/99 |
| 2009/0302307 A1 | * | 12/2009 | Gronninger | B82Y 20/00 257/13 |
| 2010/0270567 A1 | * | 10/2010 | Emerson | F21K 9/00 257/89 |
| 2013/0240936 A1 | * | 9/2013 | Seo | H01L 33/30 257/98 |

OTHER PUBLICATIONS

U.S. Appl. No. 14/550,016, filed Nov. 21, 2014 entitled "A method for making light-emitting device", with English Abstract, 1 Page.

* cited by examiner

*Primary Examiner* — Benjamin Sandvik
*Assistant Examiner* — Gustavo Ramallo
(74) *Attorney, Agent, or Firm* — Ditthavong & Steiner, P.C.

(57) ABSTRACT

A light-emitting device is provided. The light-emitting device comprises: a light-emitting stack having an active layer emitting first light having a peak wavelength λ nm; and an adjusting element stacked electrically connected to the active layer in series for tuning a forward voltage of the light-emitting device; wherein the forward voltage of the light-emitting device is between (1240/0.8λ) volt and (1240/0.5λ) volt.

20 Claims, 9 Drawing Sheets

LIGHT-EMITTING DEVICE WITH ADJUSTING ELEMENT

TECHNICAL FIELD

The disclosure relates to a light-emitting device, and particularly to a light-emitting device comprising an adjusting element.

DESCRIPTION OF BACKGROUND ART

Light-emitting diodes (LEDs) are widely used as solid-state light sources. Compared to conventional incandescent light lamps or fluorescent light tubes, LEDs have advantages such as lower power consumption and longer lifetime, and therefore LEDs gradually replace the conventional light sources and are applied to various fields such as traffic lights, back light modules, street lighting, and biomedical device.

SUMMARY OF THE INVENTION

The present disclosure provides a light-emitting device. The light-emitting device comprises: a light-emitting stack comprising an active layer emitting first light having a peak wavelength λ nm; and an adjusting element stacked electrically connected to the active layer in series for tuning a forward voltage of the light-emitting device; wherein the forward voltage of the light-emitting device is between (1240/0.8λ) volt and (1240/0.5λ) volt.

BRIEF DESCRIPTION OF THE DRAWINGS

The foregoing aspects and many of the attendant advantages of this application will become more readily appreciated as the same becomes better understood by reference to the following detailed description, when taken in conjunction with the accompanying drawings, wherein.

DETAILED DESCRIPTION OF PREFERRED EMBODIMENTS

Figure 1:
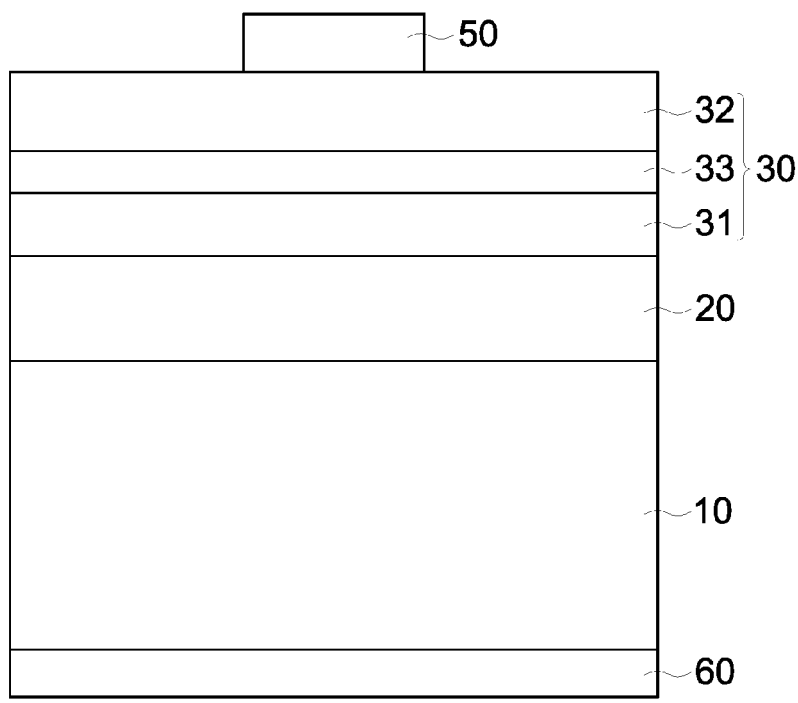
FIG. 1 is a cross-sectional diagram showing the first embodiment of a light-emitting device in accordance with the present disclosure.

Exemplary embodiments of the present disclosure will be described in detail with reference to the accompanying drawings hereafter. The following embodiments are given by way of illustration to help those skilled in the art fully understand the spirit of the present disclosure. Hence, it should be noted that the present disclosure is not limited to the embodiments herein and can be realized by various forms or combinations of the embodiments. Further, the drawings are not precise scale and components may be exaggerated in view of width, height, length, etc. Herein, the similar or identical reference numerals will denote the similar or identical components throughout the drawings.

In the present disclosure, if not specifically mention, the general expression of the formulas means a stoichiometric compound or a non-stoichiometric compound, wherein the total elemental composition of group-III elements is substantially equal or unequal to the total elemental composition of group-V elements, for example, the general expression of AlGaAs means a stoichiometric compound or a non-stoichiometric compound comprising group III elements of Al and/or Ga and group V element of As, and the total elemental composition of group-III elements is substantially equal or unequal to the total elemental composition of group-V elements.

Preferably, the general expression of AlGaAs means $Al_xGa_{(1-x)}As$, wherein $0 \leq x \leq 1$; the general expression of AlInP means $Al_xIn_{(1-x)}P$, wherein $0 \leq x \leq 1$; the general expression of AlGaInP means $(Al_yGa_{(1-y)})_{1-x}In_xP$, wherein $0 \leq x \leq 1$, $0 \leq y \leq 1$; the general expression of AlGaN means $Al_xGa_{(1-x)}N$, wherein $0 \leq x \leq 1$; the general expression of AlAsSb means $Al_xAs_{(1-x)}Sb$ wherein $0 \leq x \leq 1$ and the general expression of InGaP means $In_xGa_{1-x}P$, wherein $0 \leq x \leq 1$; the general expression of InGaAsP means $In_xGa_{1-x}As_{1-y}P_y$, wherein $0 \leq x \leq 1$, $0 \leq y \leq 1$; the general expression of InGaAsN means $In_xGa_{1-x}As_{1-y}N_y$, wherein $0 \leq x \leq 1$, $0 \leq y \leq 1$; the general expression of AlGaAsP means $Al_xGa_{1-x}As_{1-y}P_y$, wherein $0 \leq x \leq 1$, $0 \leq y \leq 1$; the general expression of InGaAs means $In_xGa_{1-x}As$, wherein $0 \leq x \leq 1$; the general expression of AlGaN means $Al_xGa_{1-x}N$, wherein $0 \leq x \leq 1$; the general expression of InGaN means $In_xGa_{1-x}N$, wherein $0 \leq x \leq 1$. The content of the element can be adjusted for different purposes, such as, but not limited to, matching the lattice constant of the growth substrate or adjusting the peak wavelength or the dominant wavelength.

FIG. 1 is a cross-sectional diagram showing the first embodiment of a light-emitting device 1 in accordance with the present disclosure. The light-emitting device 1 comprises a growth substrate 10, an adjusting element 20 on the growth substrate 10, a light-emitting stack 30 on the adjusting element 20, a first electrode 50 on the light-emitting stack 30, and a second electrode 60 on the other side of the growth substrate 10 opposite to the light-emitting stack 30.

In the present embodiment, the adjusting element 20 and the light-emitting stack 30 are vertically stacked and grown on the same growth substrate 10. The light-emitting device 1 is in die form and has a forward voltage. In the present disclosure, the term "die" means the light-emitting device 1 is directly obtained from a dicing step of a wafer comprising the growth substrate 10, the adjusting element 20, the light-emitting stack 30, the first electrode 50 and the second electrode 60, and the light-emitting device 1 is devoid of a lead frame as well-known in the art. In the present embodiment, the growth substrate 10 comprises GaAs. In one embodiment, the growth substrate 10 has a crystal plane inclined at an angle with respect to the (100) plane as a main growth surface. Preferably, the angle is between 2 degrees and 15 degrees both inclusive.

The light-emitting stack 30 comprises a first semiconductor layer 31 on the adjusting element 20, a second semiconductor layer 32 on the first semiconductor layer 31, and a first active layer 33 interposed between the first semiconductor layer 31 and the second semiconductor layer 32. The first semiconductor layer 31 and the second semiconductor layer 32 are of different conductivity types. In the present embodiment, the first semiconductor layer 31 is n type for providing electrons, and the second semiconductor layer 32 is p type for providing holes. The band gap of the first semiconductor layer 31 and the band gap of the second semiconductor layer 32 are both higher than the band gap of the first active layer 33 for confining electrons or holes within the first active layer 33. The first active layer 33 emits first light having a first peak wavelength $\lambda_1$. Preferably, the first light is a visible red light having the first peak wavelength $\lambda_1$ between 580 nm and 700 nm, and preferably, between 600 nm and 650 nm. The first semiconductor layer 31 and the second semiconductor layer 32 comprise a Group III-V semiconductor material, such as AlGaAs, AlInP or AlGaInP.

Figure 2:
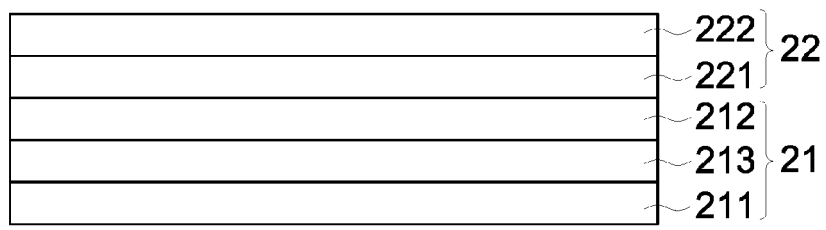
FIG. 2 is a cross-sectional diagram showing the adjusting element of the first embodiment of the light-emitting device in FIG. 1.

FIG. 2 is a cross-sectional diagram showing the adjusting element of the first embodiment of the light-emitting device 1 in FIG. 1. The adjusting element 20 has a total thickness between 0.3% and 3% of the total thickness of the light-emitting device 1, and preferably, between 0.3% and 1%. The adjusting element 20 comprises a diode 21 and a tunneling junction 22. The diode 21 is between the growth substrate 10 and the tunneling junction 22. In the present embodiment, the diode 21 comprises a third semiconductor layer 211, a fourth semiconductor layer 212 and a second active layer 213 between the third semiconductor layer 211 and the fourth semiconductor layer 212. The third semiconductor layer 211 and the fourth semiconductor layer 212 are of different conductivity types. In the present embodiment, the third semiconductor layer 211 is n-type for providing electrons, the fourth semiconductor layer 212 is p-type for providing holes. The band gap of the third semiconductor layer 211 and the band gap of the fourth semiconductor layer 212 are not less than the band gap of the second active layer 213. The third semiconductor layer 211 and the fourth semiconductor layer 212 each has a thickness not less than 100 nm, and preferably between 100 nm and 500 nm. The third semiconductor layer 211 and the fourth semiconductor layer 212 comprise a Group III-V semiconductor material, such as AlGaAs.

Figure 3:
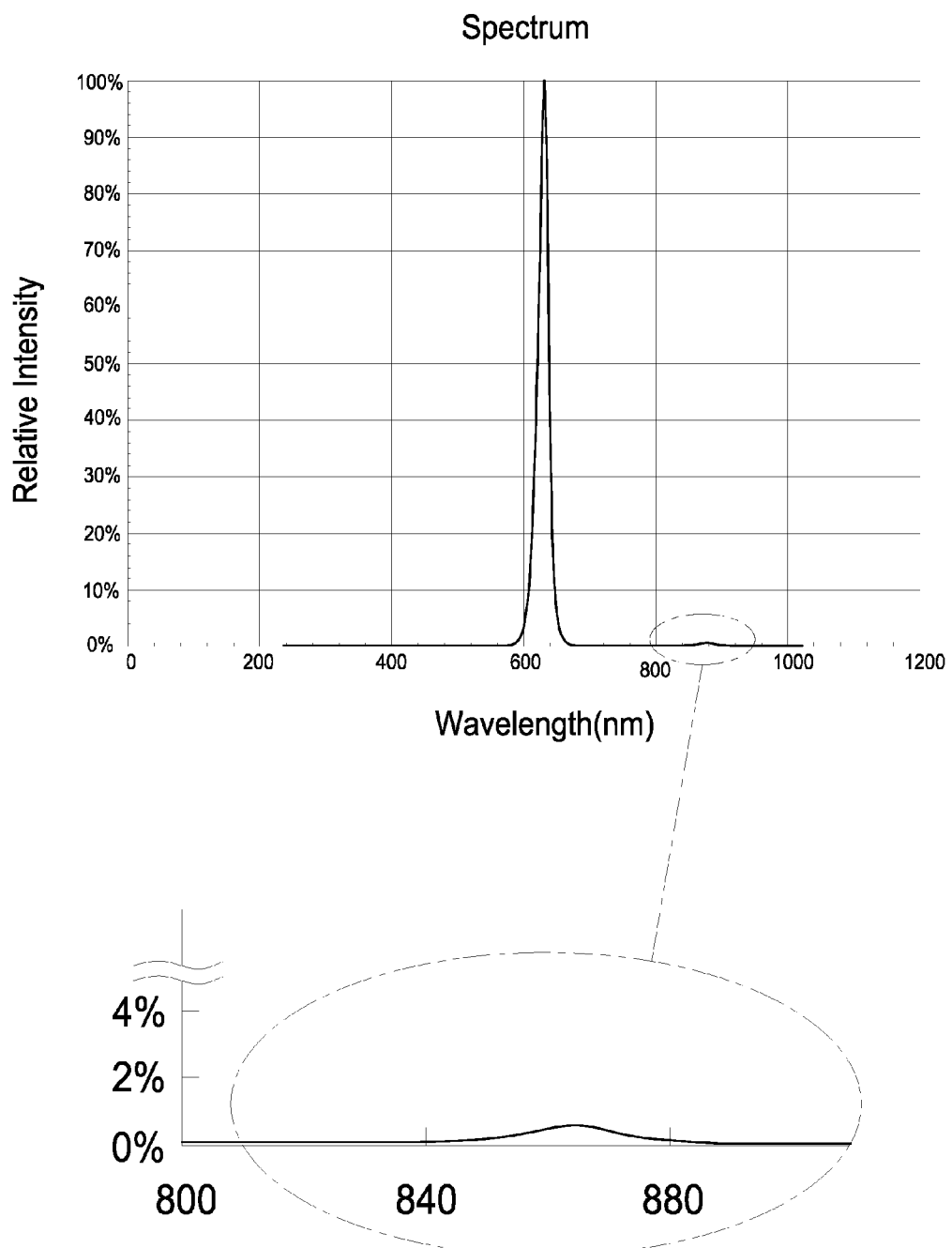
FIG. 3 is a spectrum shows the relative intensity of the first light emitted from the first active layer and the second light emitted from the second active layer.

In the present embodiment, the second active layer 213 emits a second light having a second peak wavelength $\lambda_2$. The second light is an infrared red light having the second peak wavelength $\lambda_2$ between 800 nm and 1900 nm, and preferably, between 850 nm and 1500 nm. Since the diode 21 in the adjusting element 20 emits a second light having a peak wavelength between 800 nm and 1900 nm, the color of the first light will not be affected by the invisible second light. Preferably, the difference between the first peak wavelength $\lambda_1$ and the second peak wavelength $\lambda_2$ is larger than 150 nm, and not greater than 1300 nm. FIG. 3 is a spectrum shows the relative intensity of the first light emitted from the first active layer 33 at the first peak wavelength $\lambda_1$ and the second light emitted from the second active layer 213 at the second peak wavelength $\lambda_2$. In one embodiment, at a current of about 5±0.5 mA, the ratio of the intensity of the first light emitted from the first active layer 33 at the first peak wavelength $\lambda_1$ to the intensity of the second light emitted from the second active layer 213 at the second peak wavelength $\lambda_2$ is larger than 10 and not greater than 1000, and preferably, between 50 and 350. In one embodiment, at a current of about 100±0.5 mA, the ratio of intensity of the first light emitted from the first active layer 33 at the first peak wavelength $\lambda_1$ to the intensity of the second light emitted from the second active layer 213 at the second peak wavelength $\lambda_2$ is larger than 5 and not greater than 100, and preferably, between 5 and 20.

In one embodiment, the structure of the first active layer 33 and the second active layer 213 can be single heterostructure (SH), double heterostructure (DH), double-side double heterostructure (DDH) or multi-quantum well (MQW). In the present embodiment, the structure of the first active layer 33 comprises Multi-Quantum Well (MQW). Specifically, the first active layer 33 and the second active layer 213 both comprise alternate well layers and barrier layers. The band gaps of the barrier layers in the first active layer 33 are higher than the band gaps of the well layers in the first active layer 33. The band gaps of the barrier layers in the second active layer 213 are higher than the band gaps of the well layers in the second active layer 213. The band gaps of the barrier layers in the first active layer 33 are lower than the band gap of the first semiconductor layer 31 and the band gap of the second semiconductor layer 32. The band gaps of the barrier layers in the second active layer 213 are not greater than the band gap of the third semiconductor layer 211 and the band gap of the fourth semiconductor layer 212. The first peak wavelength of the first light emitted from the first active layer 33 and the second peak wavelength of the second light emitted from the second active layer 213 can be changed by adjusting the thicknesses and the material of the well layers. Preferably, the material of the well layers in the first active layer 33 comprises a Group III-V semiconductor material, such as AlGaInP. The material of the barrier layers in the first active layer 33 comprises a Group III-V semiconductor material, such as AlGaInP. Preferably, the material of the well layers in the second active layer 213 comprises a Group III-V semiconductor material, such as InGaAs. The material of the barrier layers in the second active layer 213 comprises a Group III-V semiconductor material, such as AlGaAsP or AlGaAs. The pair number of the well layers and the barrier layers in the first active layer 33 is greater than the pair number of the well layers and the barrier layers in the second active layer 213, wherein a well layer and a barrier layer are regarded as a pair. Preferably, the pair number of the first active layer 33 is greater than 10. The pair number of the second active layer 213 is less than 10. Preferably, a ratio of the pair number of the first active layer 33 to the pair number of the second active layer 213 is not less than 3, and preferably, between 5 and 20, for obtaining a better epitaxial quality of the light-emitting device 1.

The tunneling junction 22 comprises a first tunneling layer 221 and a second tunneling layer 222 stacked vertically between the diode 21 and the light-emitting stack 30. The first tunneling layer 221 has a conductivity type different from that of the second tunneling layer 222. In the present embodiment, the first tunneling layer 221 is a p-type semiconductor, and the second tunneling layer 222 is an n-type semiconductor. The n-type dopant is Te, or Si. The p-type dopant is C or Mg. In one embodiment, the n-type dopant is Te, and the p-type dopant is C. The first tunneling layer 221 and the second tunneling layer 222 are with a doping concentration such as higher than $1\times10^{18}$ cm$^{-3}$, and preferably, not less than $5\times10^{18}$ cm$^{-3}$ and more preferably, between $5\times10^{18}$ cm$^{-3}$ and $1\times10^{22}$ cm$^{-3}$. The tunneling junction 22 converts incoming electrons into holes or converts incoming holes into electrons. The diode 21 is electrically connected to the light-emitting stack 30 in series by the tunneling junction 22. That is, the light-emitting stack 30 and the diode 21 form a pn-pn or an np-np structure. The first tunneling layer 221 and the second tunneling layer 222 comprise a Group semiconductor material, such as InGaP or AlGaAs. Preferably, the band gap of the first tunneling layer 221 and the band gap of the second tunneling layer 222 are greater than the band gap of the second active layer 213. The thickness of the second tunneling layer 222 is not less than 5 nm, and preferably, not greater than 100 nm. In one embodiment, the thickness of the first tunneling layer 22a is greater than that of the second tunneling layer 222, preferably, not less than 10 nm, and more preferably, not greater than 500 nm. The difference between the thickness of the first tunneling layer 221 and the thickness of the second tunneling layer 222 is greater than 100 nm, and preferably, between 150 nm and 500 nm.

In another embodiment, the thickness of the first tunneling layer 22a is not less than 5 nm, and preferably, not greater than 100 nm. In the present embodiment, the adjusting element 20 further comprises a base layer (nor shown) between the diode 21 and the first tunneling layer 221. The base layer has a doping concentration less than that of the first tunneling layer 221. Preferably, the base layer has a thickness greater than 200 nm, and preferably between 200 nm and 500 nm. The base layer is for improving the epitaxial quality of the first tunneling layer 221 subsequently grown thereon; therefore, to prevent the forward voltage of the light-emitting device beyond or less than a predetermined value. The adjusting element 20 is stacked electrically connected to the light-emitting stack 30 in series for adjusting the forward voltage of the light-emitting device 1, and preferably, the adjusting element 20 as a whole is for increasing the forward voltage of the light-emitting device 1 to a predetermined value when compared to a light-emitting device without comprising the adjusting element 20. By comprising the adjusting element 20, the forward voltage of the light-emitting device 1 is between $(1240/0.8\lambda_1)$ volt (V) and $(1240/0.5\lambda_1)$ volt (V). Specifically, the forward voltage is between 2.5 V and 3.5 V, and preferably, between 2.9 V and 3.3 V. Specifically, the forward voltage is determined at a current of about 5±0.5 mA or at a current density of between about 18 A/cm$^2$ and 25 A/cm$^2$. In a comparative embodiment, the light-emitting device without comprising the adjusting element 20 has a forward voltage less than 2.2 V at a current of about 5±0.5 mA or at a current density of between about 18 A/cm$^2$ and 25 A/cm$^2$.

By comprising the adjusting element 20, the light-emitting device 1, which emits a visible red light having the first peak wavelength $\lambda_1$ between 580 nm and 700 nm, can be directly integrated with another blue LED and/or green LED in one embodiment of the present disclosure. As a result, the instability caused by a difference between the forward voltage of the red LED and the forward voltage of the green or blue LED is alleviated. Furthermore, the light-emitting device 1 can have a predetermined forward voltage but still remain compact by comprising the adjusting element 20 having a total thickness between 0.3% and 3% of the total thickness of the light-emitting device 1.

Figure 4:
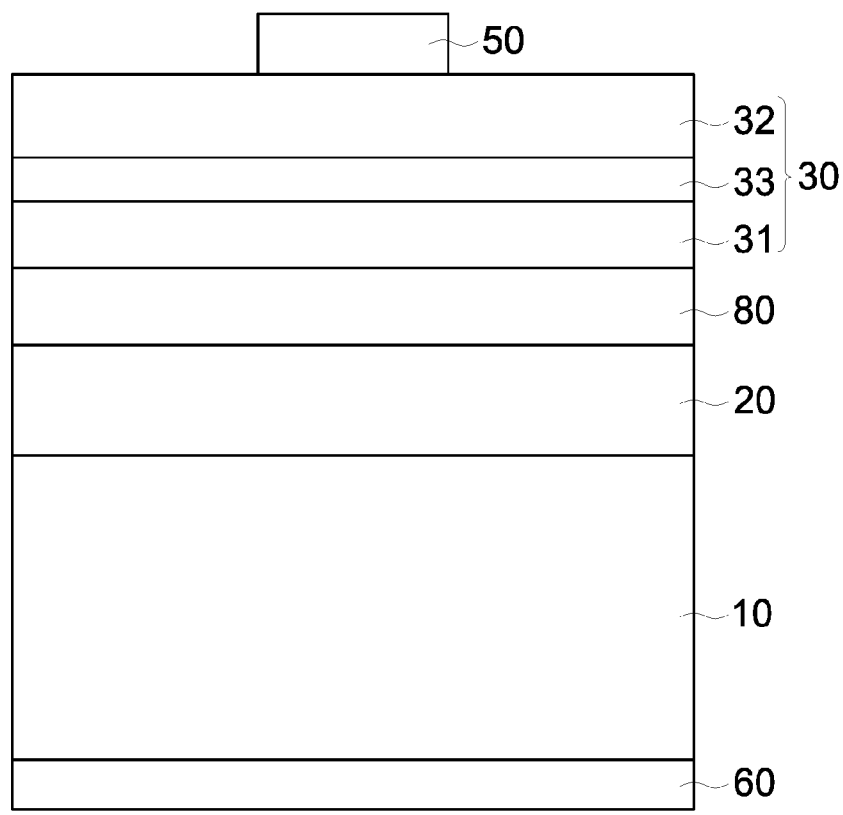
FIG. 4 is a cross-sectional diagram showing the second embodiment of a light-emitting device in accordance with the present disclosure.

FIG. 4 is a cross-sectional diagram showing the second embodiment of a light-emitting device 2 in accordance with the present disclosure. The light-emitting device 2 in accordance with the second embodiment of the present disclosure comprises substantially the same structure as the first embodiment, and the difference is that the light-emitting device 2 further comprises a buffer layer 80 between the adjusting element 20 and the light-emitting stack 30. The buffer layer 80 comprises a material substantially lattice matched to the tunneling junction 22. The buffer layer 80 is for improving the epitaxial quality of the light-emitting stack 30. Preferably, the buffer layer 80 comprises AlGaAs and has a thickness not less than 50 Å, and preferably between 80 Å and 250 nm. If the thickness of the buffer layer 80 is less than 50 Å, the buffer layer 80 will exhibit a mottled appearance, which results in poor quality of the layers grown on the buffer layer 80. In the present embodiment, the buffer layer 80 is an n-type semiconductor.

Figure 5:
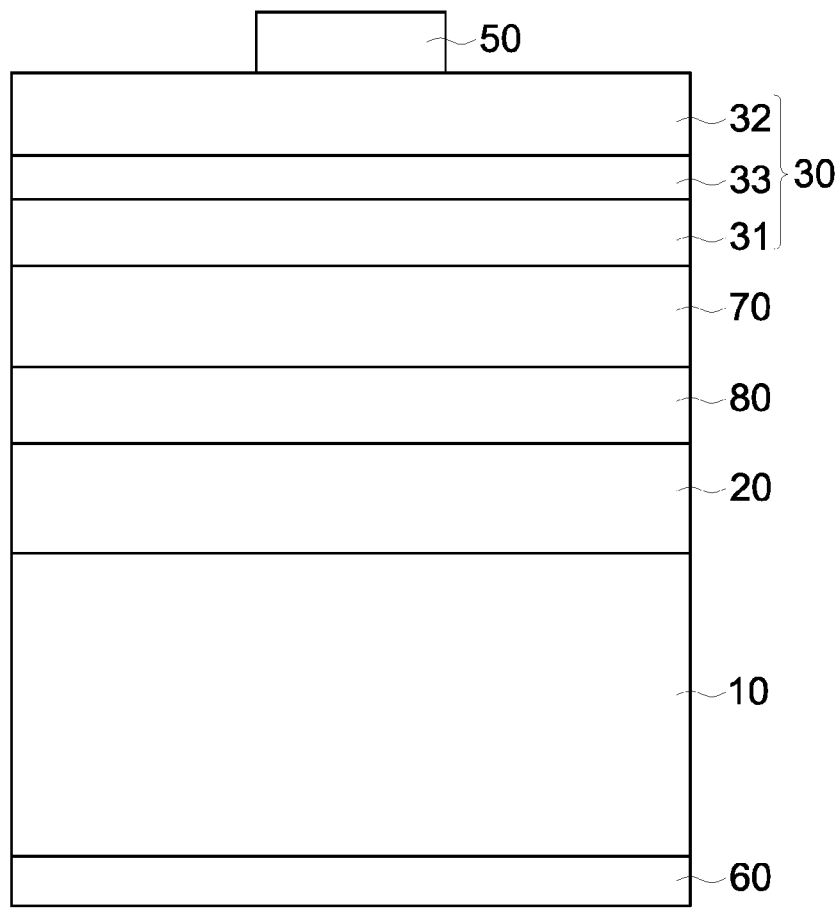
FIG. 5 is a cross-sectional diagram showing the third embodiment of a light-emitting device in accordance with the present disclosure.

FIG. 5 is a cross-sectional diagram showing the third embodiment of a light-emitting device 3 in accordance with the present disclosure. The light-emitting device 3 in accordance with the third embodiment of the present disclosure comprises substantially the same structure as the first embodiment, and the difference is that the light-emitting device 3 further comprises a reflective layer 70 between the buffer layer 80 and the light-emitting stack 30, and preferably, the reflective layer 70 comprises a Distributed Bragg reflector. In the present embodiment, the Distributed Bragg reflector has the same conductivity type of the first semiconductor layer 31 which is an n-type semiconductor. Specifically, the Distributed Bragg reflector has a doping concentration not less than $1\times10^{17}$/cm$^3$, and preferably, between $1\times10^{17}$/cm$^3$ and $1\times10^{18}$/cm$^3$. The Distributed Bragg reflector comprises alternate first sub-semiconductor layers and second sub-semiconductor layers. The first sub-semiconductor layers each has a thickness substantially the same as one another, and the thickness is substantially equals to $n\lambda/4r$, wherein r is the refractive index of the first sub-semiconductor layer, and n is an odd positive integer. The second sub-semiconductor layers each has a thickness substantially the same as one another, and the thickness is substantially equals to $n\lambda/4r$, wherein r is the refractive index of the second sub-semiconductor layer, and n is an odd positive integer. The refractive index and the thickness of the first sub-semiconductor layers are different from that of the second sub-semiconductor layers. The material of the Distributed Bragg reflector comprises a Group III-V semiconductor material, such as $Al_xGa_{(1-x)}As/Al_yGa_{(1-y)}As$ (wherein x is different from y) or $(Al_aGa_{(1-a)})_{1-x}In_xP/(Al_bGa_{(1-b)})_{1-x}In_xP$ (wherein a is different from b), wherein the content of the elements can be adjusted for reflecting a predetermined wavelength range. Preferably, the Distributed Bragg reflector has a higher reflectivity to the first peak wavelength $\lambda_1$ than to the second peak wavelength $\lambda_2$. That is to say, the Distributed Bragg reflector reflects more first light than the second light. As a result, Most of the first light is reflected toward the front side of the light-emitting device 3 where the first electrode 50 is situated at. Specifically, the difference between the reflectivity of the Distributed Bragg reflector to the first peak wavelength $\lambda_1$ and the reflectivity to the second peak wavelength $\lambda_2$ is greater than 70%, and preferably greater than 80%, and more preferably greater than 85%.

Figure 6:
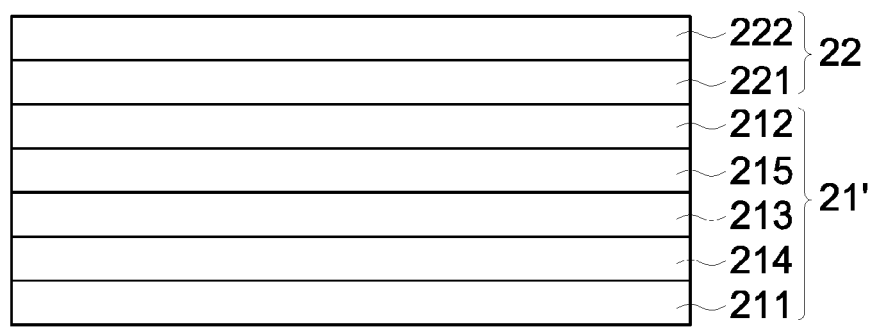
FIG. 6 is a cross-sectional diagram showing the fourth embodiment of an adjusting element in a light-emitting device in accordance with the present disclosure.

FIG. 6 is a cross-sectional diagram showing the fourth embodiment of an adjusting element 20 in a light-emitting device in accordance with the present disclosure. The light-emitting device in accordance with the fourth embodiment of the present disclosure comprises substantially the same structure as the first embodiment, and the difference is that a diode 21' in the light-emitting device further comprises a first confinement layer 214 between the third semiconductor layer 211 and the second active layer 213 for preventing the dopants in the third semiconductor layer 211 diffusing into the second active layer 213. The first confinement layer 214 has a band gap greater than the band gap of the well layers in the second active layer 213 and not greater than the band gap of the third semiconductor layer 211. The first confinement layer 214 has a thickness between the thickness of one of the barrier layers in the second active layer 213 and the thickness of the third semiconductor layer 211. Preferably, the first confinement layer 214 is undoped. In one embodiment, the diode 21' further comprises a second confinement layer 215 between the fourth semiconductor layer 212 and the second active layer 213 for preventing the dopants in the fourth semiconductor layer 212 diffusing into the second active layer 213. The second confinement layer 215 has a band gap larger than the band gap of well layers in the second active layer 213 and not greater than the band gap of the fourth semiconductor layer 212. The second confinement layer 215 has a thickness between the thickness of one of the barrier layers in the second active layer 213 and the thickness of the fourth semiconductor layer 212. The first confinement layer 214 and the second confinement layer 215 each has a thickness between 50 nm and 150 nm. The first confinement layer 214 and the second confinement layer 215 comprise a Group III-V semiconductor material, such as AlGaAs. Preferably, the first confinement layer 214 and the second confinement layer 215 are undoped.

Figure 7:
FIG. 7 is a cross-sectional diagram showing the fifth embodiment of an adjusting element in a light-emitting device in accordance with the present disclosure.

FIG. 7 is a cross-sectional diagram showing the fifth embodiment of an adjusting element 20a in a light-emitting device in accordance with the present disclosure. The light-emitting device in accordance with the fifth embodiment of the present disclosure comprises substantially the same structure as the first embodiment, and the difference is that the adjusting element 20a further comprises an intermediate layer 23 between the diode 21' and the tunneling junction 22. The intermediate layer 23 has a band gap between the band gap of the fourth semiconductor layer 212 and the band gap of the tunneling junction 22 for controlling the value of the forward voltage of the light-emitting device so as to prevent the forward voltage of the light-emitting device beyond or less than a predetermined value. The intermediate layer 23 has a thickness not less than 10 nm, and preferably between 10 nm and 100 nm. The intermediate layer 23 comprises a Group III-V semiconductor material, such as AlGaInP. Preferably, the intermediate layer 23 is a p-type semiconductor with a doping concentration less than the doping concentration of the fourth semiconductor layer 212 for decreasing the diffusion length of the dopant in the intermediate layer 23 so as to improve the quality of the light-emitting device. In one embodiment, the compositions of the intermediate layer 23 is gradually changed from the side connected to the fourth semiconductor layer 212 to the side connected to tunneling junction 22. Specifically, the intermediate layer 23 comprises an element having a composition ratio gradually changed from the side near the fourth semiconductor layer 212 to the side near the tunneling junction 22. In the present embodiment, the intermediate layer 23 comprises an element of Al gradually changed from the side near the fourth semiconductor layer 212 to the side near the tunneling junction 22 so as to gradually increase the band gap from the side near the fourth semiconductor layer 212 to the side near the tunneling junction 22. In one embodiment, the adjusting element 20a further comprises a diffusion barrier layer 24 between the intermediate layer 23 and the tunneling junction 22 for preventing the dopant in the intermediate layer 23 from diffusing into the tunneling junction 22. As a result, the quality of the tunneling junction 22 can be improved so as to prevent the forward voltage of the light-emitting device beyond or less than the predetermined value. The diffusion barrier layer 24 comprises a Group semiconductor material, such as AlGaAs. Preferably, the diffusion barrier layer 24 is undoped and has a thickness not less than the thickness of the intermediate layer 23. Specifically, the thickness of the diffusion barrier layer 24 is not less than 10 nm, and preferably, between 20 nm and 200 nm.

Figure 8:
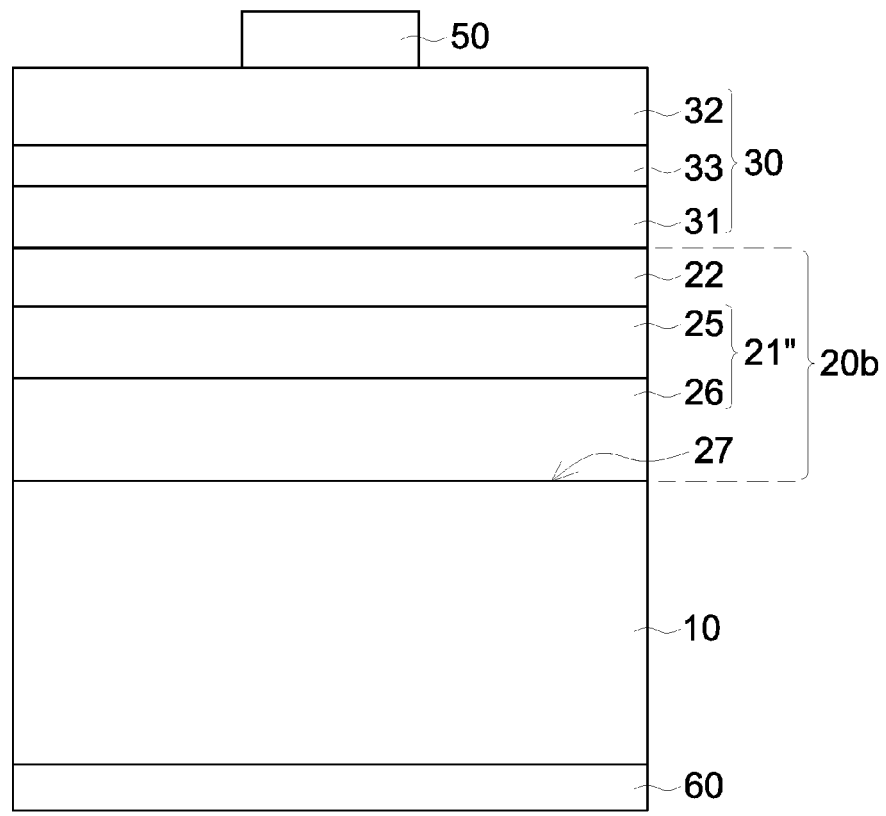
FIG. 8 is a cross-sectional diagram showing the sixth embodiment of a light-emitting device in accordance with the present disclosure.

FIG. 8 is a cross-sectional diagram showing the sixth embodiment of a light-emitting device 4 in accordance with the present disclosure. The light-emitting device 4 in accordance with the sixth embodiment of the present disclosure comprises substantially the same structure as the first embodiment, and the difference is that a diode 21" of an adjusting element 20b comprises a diffusion layer 25, a first conductivity type semiconductor layer 26 between the growth substrate 10 and the diffusion layer 25, and a p-n junction 27 between the first conductivity type semiconductor layer 26 and the growth substrate 10. The conductivity type of the growth substrate 10 is different from the conductivity type of the first conductivity type semiconductor layer 26 so as to form the p-n junction 27 therebetween. In one embodiment, the growth substrate 10 comprises Group IV semiconductor material, such as Si or Ge. The diffusion layer 25 comprises a Group III-V semiconductor material, such as GaAs or InGaP. The diffusion layer 25 is for providing an element in Group V capable of diffusing into the growth substrate 10 to form the first conductivity type semiconductor layer 26 having a conductivity type different from that of the growth substrate 10 during the epitaxial growth process, wherein the epitaxial growth process is preferably operated under a temperature of between 400° C. and 700° C. In the present embodiment, the growth substrate 10 is a p-type semiconductor, and the first conductivity type semiconductor layer 26 is an n-type semiconductor. The diffusion layer 25 has a thickness greater than 5 nm, and preferably between 10 nm and 150 nm. The first conductivity type semiconductor layer 26 has a thickness between 300 nm and 2500 nm.

Figure 9:
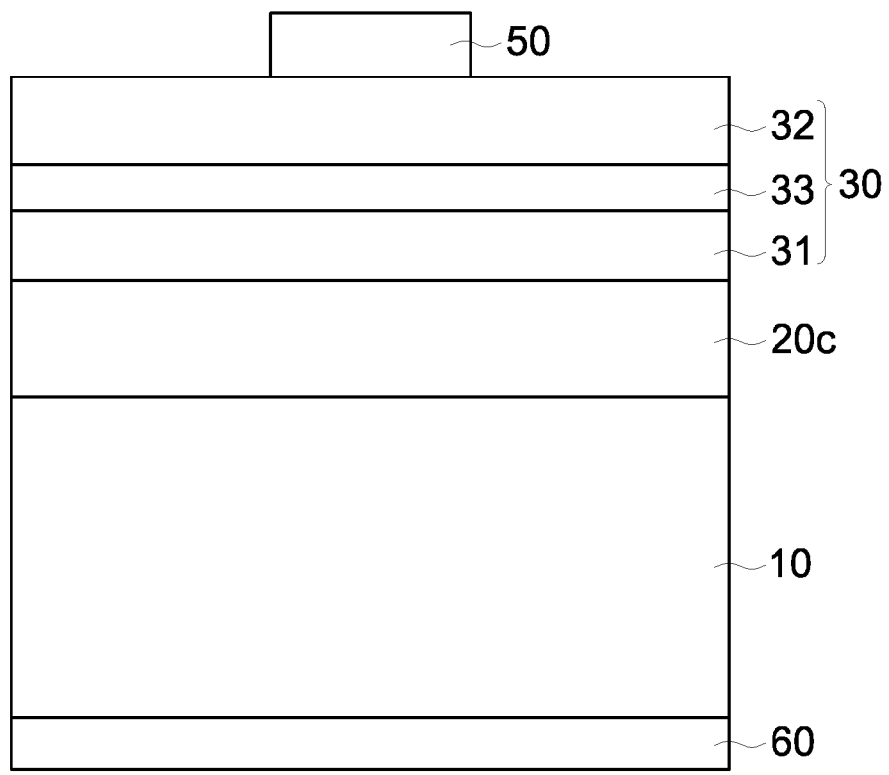
FIG. 9 is a cross-sectional diagram showing the seventh embodiment of a light-emitting device in accordance with the present disclosure.

FIG. 9 is a cross-sectional diagram showing the seventh embodiment of a light-emitting device 5 in accordance with the present disclosure. The light-emitting device 5 in accordance with the seventh embodiment of the present disclosure comprises substantially the same structure as the first embodiment, and the difference is that an adjusting element 20c comprises a Distributed Bragg reflector having the same conductivity type of the first semiconductor layer 31 and having a doping concentration less than $3 \times 10^{17}/cm^3$, and preferably, between $5 \times 10^{15}/cm^3$ and $5 \times 10^{16}/cm^3$. Specifically, the Distributed Bragg reflector in the adjusting element 20c has a resistance between 20Ω and 1000Ω. The Distributed Bragg reflector comprises alternate first sub-semiconductor layers and second sub-semiconductor layers. The first sub-semiconductor layers each has a thickness substantially the same as one another, and the thickness is substantially equals to nλ/4r, wherein r is the refractive index of the first sub-semiconductor layer, and n is an odd positive integer. The second sub-semiconductor layers each has a thickness substantially the same as one another, and the thickness is substantially equals to nλ/4r, wherein r is the refractive index of the second sub-semiconductor layer, and n is an odd positive integer. The refractive index and the thickness of the first sub-semiconductor layers are different from that of the second sub-semiconductor layers. The material of the Distributed Bragg reflector comprises a Group III-V semiconductor material, such as $Al_xGa_{(1-x)}As/Al_yGa_{(1-y)}As$ (wherein x is different from y) or $(Al_aGa_{(1-a)})_{1-x}In_xP/(Al_bGa_{(1-b)})_{1-x}In_xP$ (wherein a is different from b), wherein the content of the elements can be adjusted for reflecting a predetermined wavelength range, preferably, the Distributed Bragg reflector has a reflectivity higher than 90% to the first peak wavelength $λ_1$, and preferably, higher than 95% to the first peak wavelength $λ_1$.

Figure 10:
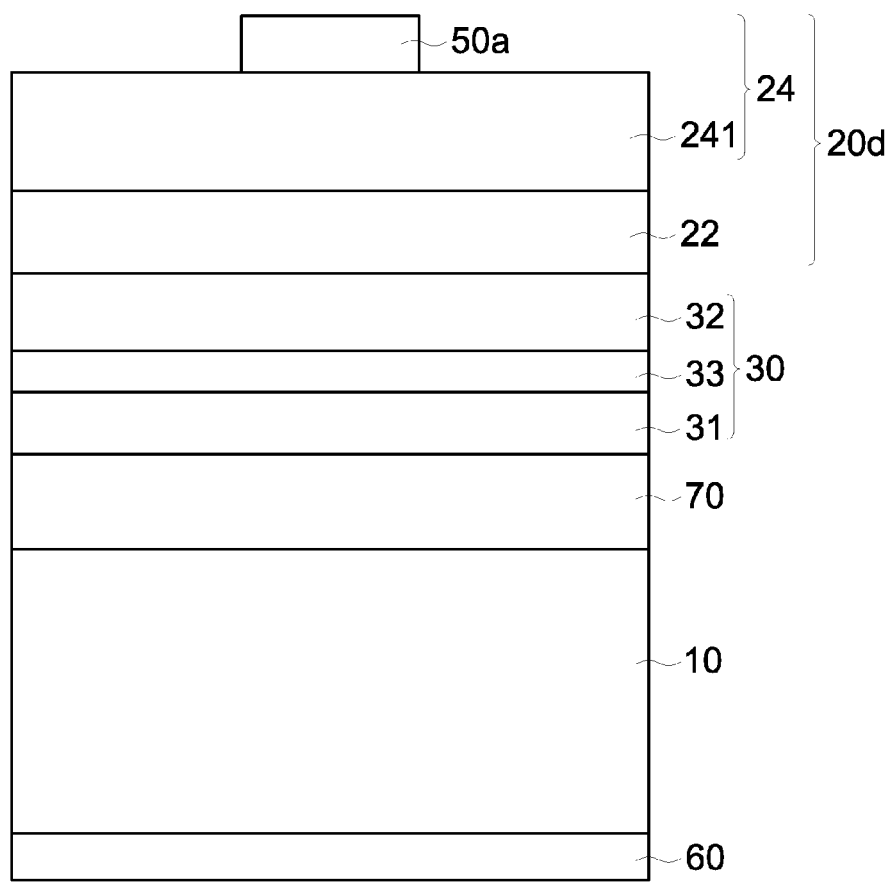
FIG. 10 is a cross-sectional diagram showing the eighth embodiment of a light-emitting device in accordance with the present disclosure.

FIG. 10 is a cross-sectional diagram showing the eighth embodiment of a light-emitting device 6 in accordance with the present disclosure. The light-emitting device 6 in accordance with the eighth embodiment of the present disclosure comprises substantially the same structure as the first embodiment, and the difference is that the light-emitting device 6 comprises the reflector 70 as disclosed in the embodiment shown in FIG. 5, and an adjusting element 20d on the light-emitting stack 30. The adjusting element 20d comprises a tunneling junction 22 as described in the embodiments of the present disclosure and a Schottky diode 24. The Schottky diode 24 comprises a fifth semiconductor layer 241 and the first electrode 50a. The fifth semiconductor layer 241 has a thickness less than that of the second semiconductor layer 32 and has a doping concentration less than that of the second semiconductor layer 32. Preferably, the fifth semiconductor layer 241 has a thickness not less than 30 nm, and preferably, between 40 and 500 nm. The fifth semiconductor layer 241 has a doping concentration not greater than $1×10^{17}$ cm$^{-3}$, and preferably, between $5×10^{12}$ cm$^{-3}$ and $5×10^{16}$ cm$^{-3}$. As a result, a Schottky junction is formed between the fifth semiconductor layer 241 and the first electrode 50a.

Figure 11:
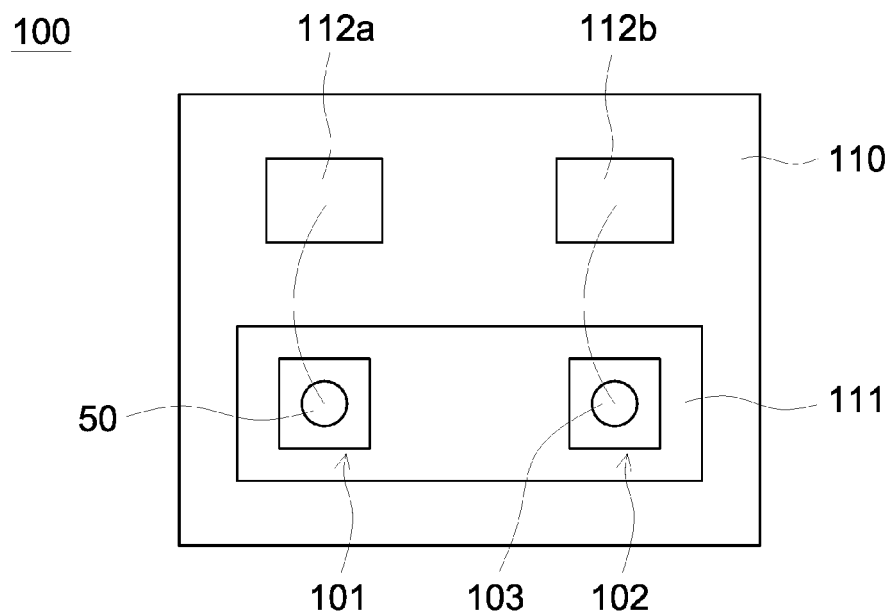
FIG. 11 is a top view showing the first embodiment of a light-emitting module in accordance with the present disclosure.

FIG. 11 is a top view showing a first embodiment of a light-emitting module 100 in accordance with the present disclosure. The light-emitting module 100 comprises a first light-emitting die 101 and a second light-emitting die 102 electrically connected to the first light-emitting die 101. The first light-emitting die 101 comprises any one of the light-emitting devices as mentioned above, wherein the light-emitting device is configured to emit a first radiation having a first peak wavelength $λ_1$ between 580 and 700 nm, and the first light-emitting die having a first forward voltage. The second light-emitting die 102 is configured to emit a second radiation having a second peak wavelength in a first range between 400 and 480 nm or in a second range between 500 and 590 nm, and the second light-emitting die 102 has a second forward voltage. A difference between the first forward voltage and the second forward voltage is not more than 0.5 V. In the present embodiment, the first forward voltage is between 3 V and 3.3 V, and the second forward voltage is between 3 V and 3.3 V. The second light-emitting die 102 comprises a common structure well-known in the art to emit a second radiation having a second peak wavelength, which is different from the first peak wavelength, in a first range between 400 and 480 nm or in a second range between 500 and 590 nm for example. In the present embodiment, the first light-emitting die 101 and the second light-emitting die 102 may be on a common carrier 110 comprising a first electrode pad 111 with a first polarity and multiple discrete second electrode pads 112a, 112b with a second polarity different from the first polarity. The first light-emitting die 101 and the second light-emitting die 102 may be commonly on the first electrode pad 111 to electrically connected to the second electrode of the first light-emitting die 101 and electrically connected to one of the electrodes of the second light-emitting die 102, and the first electrode 50 of the first light-emitting die 101 and the other electrode 103 of the second light-emitting die 102 are wire bonded to the second electrode pads 112a, 112b respectively. The first light-emitting die 101 and the second light-emitting die 102 may operate independently. For example, the first light-emitting die 101 is operated by controlling the first electrode pad 111 and the second electrode pad 112a. In the present embodiment, because the first light-emitting die 101 comprises a light-emitting device comprising an adjusting element of the present disclosure, a difference between the first forward voltage of the first light-emitting die 101 and the second forward voltage of the second light-emitting die 102 is not more than 0.5 V at a current of about 5±0.5 mA or at a current density of between about 18 A/cm$^2$ and 25 A/cm$^2$. As a result, the instability caused by a difference between the forward voltage of the first light-emitting die 101 and the forward voltage of the second light-emitting die is alleviated.

Figure 12:
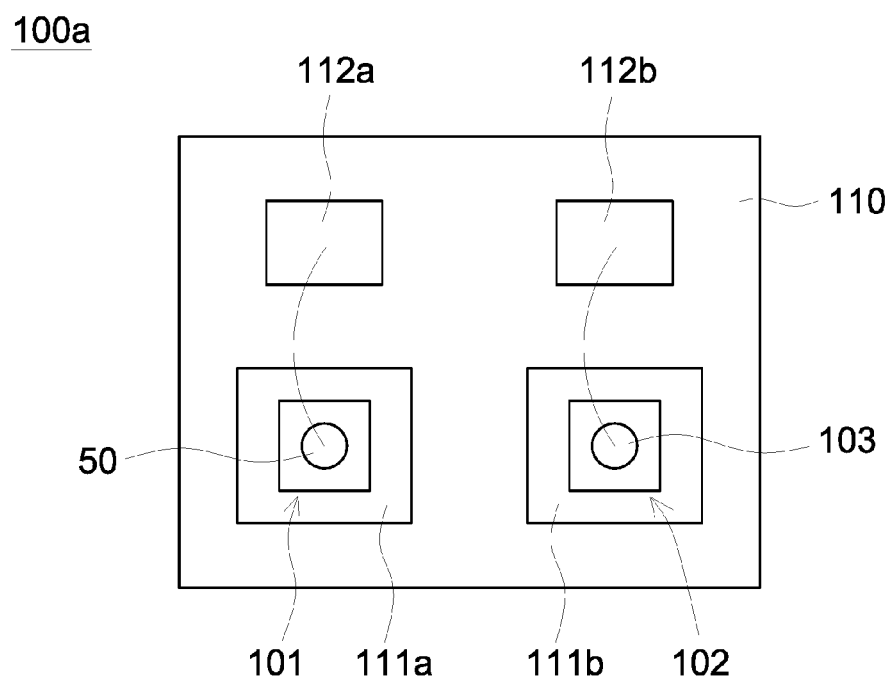
FIG. 12 is a top view showing the second embodiment of a light-emitting module in accordance with the present disclosure.

FIG. 12 is a top view showing a second embodiment of a light-emitting module 100a in accordance with the present disclosure. The light-emitting module 100a in accordance with the second embodiment of the present disclosure comprises substantially the same structure as the first embodiment shown in FIG. 11, and the difference is that the carrier 110 comprises multiple discrete first electrode pads 111a, 111b for electrically connected to the second electrode of the first light-emitting die 101 and electrically connected to one of the electrodes of the second light-emitting die 102 respectively. The first light-emitting die 101 and the second light-emitting die 102 may operate independently. For example, the first light-emitting die 101 is operated by controlling the first electrode pad 111a and the second electrode pad 112a.

Figure 13:
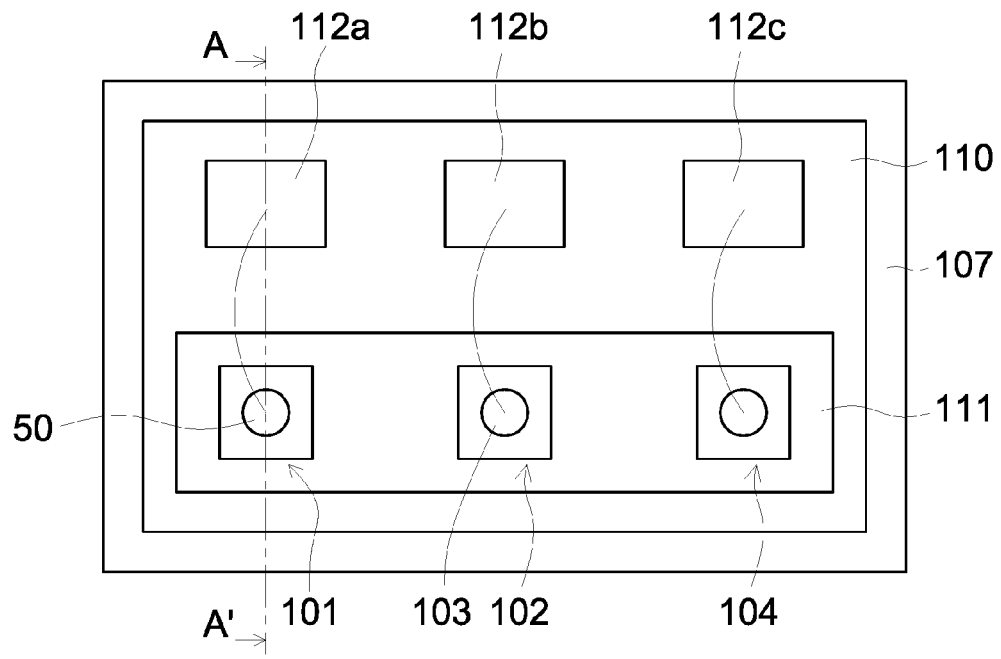
FIG. 13 is a top view showing the third embodiment of a light-emitting module in accordance with the present disclosure.

FIG. 13 is a top view showing a third embodiment of a light-emitting module 100c in accordance with the present disclosure. The light-emitting module 100c in accordance with the third embodiment of the present disclosure comprises substantially the same structure as the first embodiment shown in FIG. 11, and the difference is that the light-emitting module 100c further comprises a third light-emitting die 104 configured to emit a third radiation having a third peak wavelength in a first range between 400 and 480 nm or in a second range between 500 and 590 nm, and the third light-emitting die 104 having a third forward voltage. In the present embodiment, the third peak wavelength and the second peak wavelength are in the first range and in the second range respectively, and a difference between the first forward voltage and the third forward voltage is not more than 0.5 V at a current of about 5±0.5 mA or at a current density of between about 18 A/cm$^2$ and 25 A/cm$^2$. The first light-emitting die 101, the second light-emitting die 102, and the third light-emitting die 104 may operate independently. For example, the first light-emitting die 101 is operated by controlling the first electrode pad 111 and the second electrode pad 112a. The first radiation of the first light-emitting die, the second radiation of the second light-emitting die, and the third radiation of the third light-emitting die are capable of being mixed together for emitting a white light having a color temperature greater than 10000K. Preferably, the white light has chromaticity coordinates (x, y) on CIE 1931 chromaticity diagram, wherein $0.27 \leq x \leq 0.285$, $0.23 \leq y \leq 0.26$.

Figure 14:
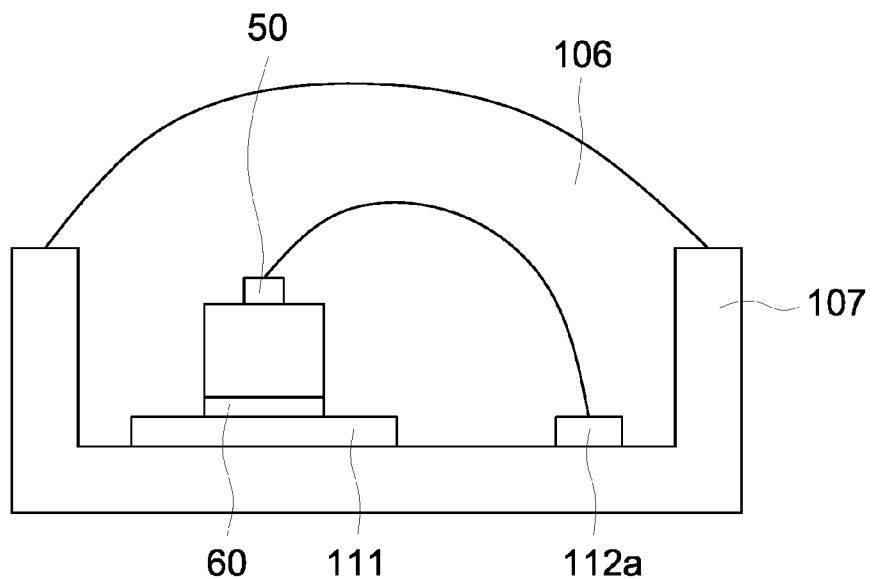
FIG. 14 is a cross-sectional diagram of the third embodiment along an A-A' line in FIG. 13.

FIG. 14 is a cross-sectional diagram of the third embodiment along an A-A' line in FIG. 13. The light-emitting module 100c can be further encapsulated by a supporting structure 106. The supporting structure 106 can be a transparent structure, primarily constructed of one or more of organic material and/or inorganic material. The organic material can be epoxy, polyimide (PI), BCB, perfluorocyclobutane (PFCB), Sub, acrylic resin, polymethyl methacrylate (PMMA), polyethylene terephthalate (PET), polycarbonate (PC), polyetherimide, or fluorocarbon polymer. The inorganic material can be glass, $Al_2O_3$, SINR, or SOG. An encapsulated light-emitting module 100c can be a pixel of a display, and preferably, for an outdoor LED display. Alternatively, several encapsulated light-emitting module 100c can be further mounted on a submount, and interconnected to be a pixel of a LED display module (not shown). In one embodiment, the encapsulated light-emitting module 100c further comprises a fence 107 surrounding the first light-emitting die 101, the second light-emitting die 102, and the third light-emitting die 104 as shown in FIG. 13 and FIG. 14. The fence 107 is configured to absorb or reflect light and comprises a non-transparent material, such as a plastic with a black or white coating thereon or a plastic mixed with a black or white coating to form an integrated structure. The plastic comprises silicone, epoxy, polyimide (PI), BCB, perfluorocyclobutane (PFCB), Su8, acrylic resin, polymethyl methacrylate (PMMA), polyethylene terephthalate (PET), polycarbonate (PC), polyetherimide, polyurethane (PU), or polydimethylsiloxane (PDMS). The fence 107 can be used for reducing the possibility of crosstalk between adjacent encapsulated light-emitting modules 100c.

In one embodiment, a part of the light-emitting stack 30 is removed by any suitable method so as to expose the first semiconductor layer 31, and the second electrode 60 is formed on the exposed first semiconductor layer 31. As a result, the first electrode 50/50a and the second electrode 60 are on the same side of the growth substrate 10. In one embodiment, an outer surface of the first electrode 50/50a opposite to the light-emitting stack 30 is substantially coplanar with the outer surface of the second electrode 60 opposite to the light-emitting stack 30. As a result, the light-emitting device is capable of being bonded to another carrier comprising electrical circuits by flip chip bonding process.

In one embodiment, the growth substrate 10 can be replaced with a permanent substrate by bonding process. In one embodiment, the light-emitting device of the present disclosure further comprises a conductive connecting structure between the permanent substrate and the light-emitting stack 30 for mechanically connecting the permanent substrate and the light-emitting stack 30. The conductive connecting structure comprises transparent conducive material or metal material. The transparent conductive material comprises transparent conductive oxide material comprising indium tin oxide (ITO), indium oxide (InO), tin oxide (SnO), cadmium tin oxide (CTO), antimony tin oxide (ATO), aluminum zinc oxide (AZO), zinc tin oxide (ZTO), gallium doped zinc oxide (GZO), tungsten doped indium oxide (IWO), zinc oxide (ZnO), or indium zinc oxide (IZO). The metal material comprises In, Sn, Au, Ti, Ni, Pt, W or the combinations thereof.

The first electrode 50, 50a and the second electrode 60 are for electrically connected to a power source and for conducting a current therebetween. In one embodiment, the material of the first electrode 50, 50a and the second electrode 60 comprise transparent conductive material or metal material, wherein the transparent conductive material comprises transparent conductive oxide, and wherein the metal material comprises Au, Pt, GeAuNi, Ti, BeAu, GeAu, Al, or ZnAu, Ni.

In one embodiment, when the first electrode 50, 50a and the second electrode 60 are on the opposite sides of the permanent substrate, the permanent substrate is electrically conductive for conducting a current flowing between the first electrode 50, 50a and the second electrode 60. The permanent substrate comprises a conductive material comprising Si, Cu, Al, Mo, Sn, Zn, Cd, Ni, Co, diamond like carbon (DLC), graphite, carbon fiber, metal matrix composite (MMC) or ceramic matrix composite (CMC). Preferably, the permanent substrate comprises Si. In one embodiment, when the first electrode 50, 50a and the second electrode 60 are on the same side of the permanent substrate, the permanent substrate may not be conductive, and the permanent substrate may comprise sapphire or glass for example. The permanent substrate has a thickness thick enough for supporting the layers or structures thereon, for example, greater than 100 and preferably smaller than 200 μm.

In one embodiment, any one of the light-emitting devices as mentioned previously may further comprises a contact layer between the second semiconductor layer 32 and the first electrode 50/50a such that the first electrode 50/50a is electrically connected to the light-emitting stack 30 through the contact layer for forming a specific contact resistance less than $10^{-3}$ $\Omega/cm^2$ or the resistance between the first electrode 50/50a and the light-emitting stack 30 is lower than $10^{-2}$ ohm-cm.

The contact layer has a doping concentration greater than $10^{18}/cm^3$, and preferably, between $5 \times 10^{18}/cm^3$ and $5 \times 10^{20}/cm^3$ both inclusive. The material of the contact layer comprises a Group III-V semiconductor material, such as GaAs, AlGaAs, InGaP, GaP or AlGaInP.

In one embodiment, any one of the light-emitting devices as mentioned previously may further comprise a sixth semiconductor layer (not shown) between the first electrode 50/50a and the light-emitting stack 30 or between the contact layer and the light-emitting stack 30 for improving light extraction and/or for improving current spreading through the light-emitting stack 30. The sixth semiconductor layer has a thickness greater than 2000 nm, and preferably between 2500 nm and 7000 nm. In one embodiment, the sixth semiconductor layer has a thickness less than 500 nm, and preferably between 100 nm and 300 nm. In one embodiment, the sixth semiconductor layer has a band gap greater than that of the first active layer 33. In one embodiment, the sixth semiconductor layer is substantially transparent to the first light. In one embodiment, the sixth semiconductor layer has a doping concentration greater than that of the $1 \times 10^{17}/cm^3$. In one embodiment, the sixth semiconductor layer comprises a surface opposite to the growth substrate 10 and facing the first electrode 50/50a. In one of the embodiment, a part of the surface of the sixth semiconductor layer that is not covered by the first electrode 50/50a, is roughened. Preferably, the roughness is between 0.1 um and 3 μm, and preferably between 0.3 μm and 2 μm. The sixth semiconductor layer comprises a Group III-V semiconductor material, such as AlGaAs or AlGaInP.

The method of performing epitaxial growth comprises, but is not limited to metal-organic chemical vapor deposition (MOCVD), hydride vapor phase epitaxy (HVPE), molecular beam epitaxy (MBE), or liquid-phase epitaxy (LPE).

The foregoing description of preferred and other embodiments in the present disclosure is not intended to limit or restrict the scope or applicability of the inventive concepts conceived by the Applicant. In exchange for disclosing the inventive concepts contained herein, the Applicant desires all patent rights afforded by the appended claims. Therefore, it is intended that the appended claims include all modifications and alterations to the full extent that they come within the scope of the following claims or the equivalents thereof.

What is claimed is:

1. A light-emitting device comprising:
   a light-emitting stack comprising an active layer emitting first light having a peak wavelength λ nm; and
   an adjusting element stacked on and electrically connected to the active layer,
   wherein the adjusting element comprises a Schottky diode and a tunneling junction between the active layer and the Schottky diode,
   wherein the forward voltage of the light-emitting device is between (1240/0.8λ) volt and (1240/0.5λ) volt.

2. The light-emitting device according to claim 1, wherein the Schottky diode comprises a semiconductor layer and a first electrode on the semiconductor layer.

3. The light-emitting device according to claim 2, wherein the semiconductor layer has a thickness not less than 30 nm.

4. The light-emitting device according to claim 2, wherein the semiconductor layer has a thickness between 40 and 500 nm.

5. The light-emitting device according to claim 2, wherein the semiconductor layer has a doping concentration not greater than $1 \times 10^{17}$ cm$^{-3}$.

6. The light-emitting device according to claim 1, wherein the light-emitting device is a light-emitting die.

7. The light-emitting device according to claim 1, wherein the active layer emits a radiation having a peak wavelength between 580 and 700 nm.

8. The light-emitting device according to claim 1, wherein the forward voltage is between 2.5 V and 3.5 V.

9. The light-emitting device according to claim 1, wherein the tunneling junction comprises a first tunneling layer and a second tunneling layer, and the first tunneling layer has a conductivity type different from that of the second tunneling layer.

10. The light-emitting device according to claim 9, wherein a difference between a thickness of the first tunneling layer and a thickness of the second tunneling layer is greater than 100 nm.

11. A light-emitting device comprising:
    a light-emitting stack comprising an active layer emitting first light having a peak wavelength λ nm; and
    an adjusting element stacked on and electrically connected to the active layer, wherein the adjusting element comprises a Distributed Bragg reflector having a doping concentration not less than $5 \times 10^{15}$/cm$^3$ and less than $3 \times 10^{17}$/cm$^3$ and having a resistance between 20Ω and 1000Ω,
    wherein the forward voltage of the light-emitting device is between (1240/0.8λ) volt and (1240/0.5λ) volt.

12. The light-emitting device according to claim 11, wherein the active layer emits a radiation having a peak wavelength between 580 and 700 nm.

13. The light-emitting device according to claim 11, wherein the forward voltage is between 2.5 V and 3.5 V.

14. A light-emitting module, comprising:
    a first light-emitting die configured to emit a first radiation having a first peak wavelength between 580 and 700 nm, and the first light-emitting die having a first forward voltage;
    a second light-emitting die configured to emit a second radiation having a second peak wavelength in a first range between 400 and 480 nm or in a second range between 500 and 590 nm, and the second light-emitting die having a second forward voltage;
    wherein a difference between the first forward voltage and the second forward voltage is not more than 0.5 V; and
    a third light-emitting die configured to emit a third radiation having a third peak wavelength in the first range between 400 and 480 nm or in a second range between 500 and 590 nm, and the third light-emitting die having a third forward voltage,
    wherein the third peak wavelength and the second peak wavelength are in the first range and in the second range respectively, and a difference between the first forward voltage and the third forward voltage is not more than 0.5 V.

15. The light-emitting module according to claim 14, wherein the first light-emitting die comprises:
    a light-emitting stack having an active layer emitting the first radiation having the first peak wavelength λ; and
    an adjusting element stacked on and electrically connected to the active layer;
    wherein the first forward voltage of the first light-emitting die is between (1240/0.8λ) volt and (1240/0.5λ) volt.

16. The light-emitting module according to claim 14, wherein the first forward voltage is between 2.5 V and 3.5 V.

17. The light-emitting module according to claim 15, wherein the adjusting element comprises a diode emitting a radiation having a peak wavelength between 800 nm and 1900 nm.

18. The light-emitting module according to claim 17, wherein a ratio of the intensity of the first radiation emitted from the active layer at the first peak wavelength to the intensity of the radiation emitted from the diode at the peak wavelength is larger than 10 and not greater than 1000.

19. The light-emitting module according to claim 17, wherein the active layer of the light-emitting stack comprises alternate well layers and barrier layers, the diode comprises a second active layer comprising alternate well layers and barrier layer, and the pair number of the well layers and the barrier layers in the active layer is greater than the pair number of the well layers and the barrier layers in the second active layer.

20. The light-emitting module according to claim 17,
    wherein the adjusting element further comprises a tunneling junction between the active layer and the diode, the tunneling junction comprises a first tunneling layer and a second tunneling layer, and the first tunneling layer has a conductivity type different from that of the second tunneling layer, and
    wherein a difference between a thickness of the first tunneling layer and a thickness of the second tunneling layer is greater than 100 nm.

* * * * *